Aug. 12, 1969 W. E. MUTTER ET AL 3,461,357

MULTILEVEL TERMINAL METALLURGY FOR SEMICONDUCTOR DEVICES

Filed Sept. 15, 1967

INVENTORS
WALTER E. MUTTER
PAUL A. TOTTA

BY Wolmar J. Stoffel
ATTORNEY 3,461,357

MULTILEVEL TERMINAL METALLURGY FOR SEMICONDUCTOR DEVICES

Walter E. Mutter and Paul A. Totta, Poughkeepsie, N.Y., assignors to International Business Machines Corporation, Armonk, N.Y., a corporation of New York Filed Sept. 15, 1967, Ser. No. 668,115
Int. Cl. H01l 3/12, 5/06
U.S. Cl. 317—234 9 Claims

ABSTRACT OF THE DISCLOSURE

A metallurgy structure for a semiconductor device hermetically sealed at the chip level having a contact stripe overlying and bonded to an insulating layer covering the surface of the semiconductor body, and making electrical contact through an aperture in the layer, and a laminar stripe bonded to a glass layer overlying the insulating layer and contact stripe. The laminar stripe has a layer of copper disposed between layers of chromium. A terminal including solder can be provided in contact with the laminar stripe.

BACKGROUND OF THE INVENTION

Semiconductor devices notably transistors, diodes, etc. have revolutionized the electronics industry by replacing electron tubes in a majority of applications. This has made possible the miniaturization of electronic equipment, and increased its efficiency, dependability, etc. Monolithic and thin film integrated semiconductor devices show promise of achieving even greater miniaturization, greater dependability, and savings in cost.

Monolithic devices in general consist of a single crystal of a semiconductor material, typically silicon, having various diffused P and N type areas and combinations thereof which constitute active and passive individual circuit elements. These elements are electrically connected to form electronic circuits with etched conductor stripes on the device which are insulated therefrom with thermal oxide and glass layers. The resultant device is a very compact, efficient, and dependable unit which can be produced relatively inexpensively when done on the large scale.

While the fabrication of the conductor stripes on integrated circuit devices are relatively simple in principle, the operation presents many practical difficulties in regard to the selection of compatible materials, fabrication, alignment of masks, adherence,, interaction and alloying effects of materials, etc. Due to the very limited space available, the circuitry is very dense. This imposes series constraints on the width and thickness of the conductive stripes, contact areas, etc., which result in relatively high current densities. This consideration limits the potential choice of metals which may be used.

Further, the metal comprising the system must be strongly adherent to silicon oxide and the glass encapsulating medium. If the glass forming the seal is not mechanically adherent to the contacts, subsequent processing and/or high temperature operation will tend to disrupt the seal permitting contamination thus necessitating rejection of the semiconductor device. The metal comprising the contact system in intimate contact with the crystal must alloy with the silicon crystal in order to provide good ohmic connection, must not degrade device reliability by oxide penetration and must contribute a minimum to electrical resistance in its function as an interconnection between active regions of the device and external connections.

SUMMARY OF THE INVENTION

It is an object of this invention to provide an improved interconnection metallurgy structure for use with semiconductor devices of the planar type.

It is another object of this invention to provide a new and improved multilevel interconnection metallurgy structure for integrated monolithic semiconductor devices which is safe to use, and is capable of operating under relatively high current densities.

Still another object of this invention is to provide a new interconnection metallurgy structure, which is compatible with solder joining.

In accordance with the aforementioned objects of the invention, the mutilevel interconnection metallurgy structure of the invention for hermetically sealed planar semiconductor device has a contact stripe overlying and bonded to the surface of the layer of a silicon dioxide or equivalent insulating layer and underlying the layer of glass making ohmic contact to the semiconductor body through an aperture in the layer. A laminar stripe is bonded to the layer of glass in electrical contact with the contact stripe through an aperture in a layer of glass overlying the layer of silicon dioxide and contact stripe. The laminar stripe consists of a layer of copper disposed between layers of chromium. A terminal means is provided in electrical contact with the stripe, which terminal means includes soft solder.

BRIEF DESCRIPTION OF THE DRAWING

The foregoing and other objects, features, and advantages of the invention will be apparent from the following more particular description of preferred embodiments of the invention as illustrated in the accompanying drawings.

DESCRIPTION OF THE PREFERRED EMBODIMENTS

The requirements of each of the respective levels of a multilevel metallurgy system vary and are at least in part governed by the physical characteristics of the metals in the associated layer levels. For example, the metals used in the second layer must not unduly erode the metal in the first layer at the contact points by forming eutectic mixtures or brittle, resistive intermetallic compounds at temperatures used during subsequent processing steps of the device. The metal or metal composition of the first level of the metallurgy system should be safe in terms of junction poisoning, have good resistance to electrical migration, have good conductivity, and make ohmic contact to all doped semiconductor elements, both N and P. Still further, the metallurgy in the first layer should provide an effective barrier to diffusion of the metal used in the second layer when via holes are positioned directly over the contact holes. The metallurgy used in the second level and upper levels have good electrical conductivity, adhere to glass, are compatible with both the metal of the first level and also soft solder used in terminal connections at temperatures at which the devices will be exposed to during processing steps and also making connection. Further, the second level metallurgy should resist attack of HF etchants which are commonly used for opening via holes and terminal holes in the glass layer overlying the metallurgy.

Figure 1:
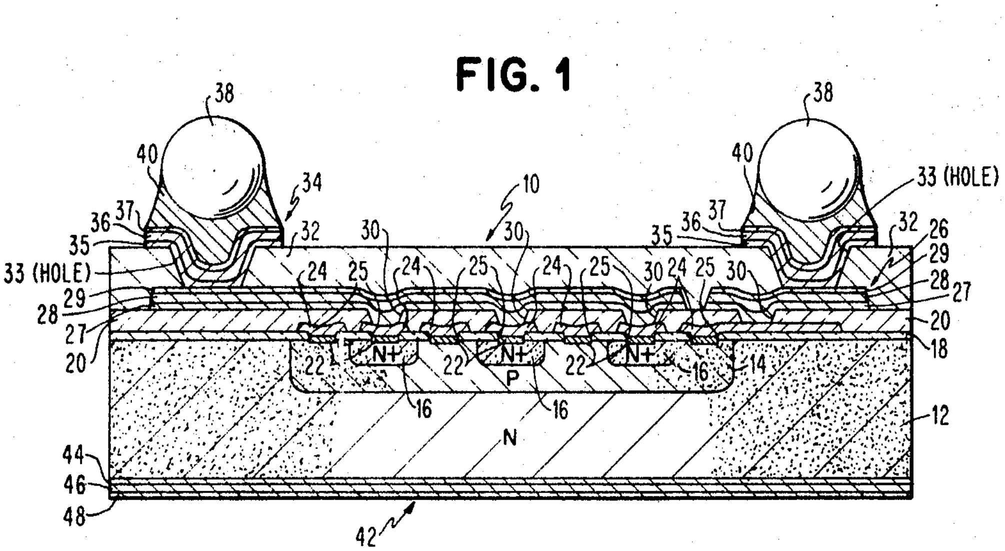
FIGURE 1 is a cross-sectional view of a preferred embodiment of the multilevel metallurgy structure of the invention for a hermetically sealed planar semiconductor device.

Referring now to FIGURE 1 of the drawing, there is depicted a preferred specific embodiment of a discrete device 10 having a body 12 of a single crystal of N type silicon with a diffused P type area 14 having a plurality of diffused N type areas 16 therein. It is understood that the P type area 14 and N type areas 16 can be of any suitable configuration and thickness and can be formed alternatively by etch and refill methods wherein a depression is etched in the body, a layer of the opposite type conductivity grown epitaxially in the depression, and subsequent layers formed in basically the same manner within the base area. A layer of silicon dioxide 18 is bonded to body 12, with an overlying glass layer 20 bonded thereto. The first level metallurgy has a thin platinum silicide or palladium silicide layer 22 at the innerface of the semiconductor body 12 in electrical contact with an overlying molybdenum contact stripe 24. Where appropriate, the molybdenum layer can take the form of a pad. As indicated in FIGURE 1, the contact stripes 24 make contact with the semiconductor body 12 through holes 25 in silicon dioxide layer 18. The stripes 24 are bonded to the layer 18 and also overlying glass layer 20. The second level metallurgy is a laminated connecting stripe configuration 26 having a lower relatively thin layer of chromium 27, a relatively thick layer 28 of copper and an overlying chromium layer 29. The purpose of the chromium is to provide a bond between the copper layer and glass of $SiO_2$ layers. Laminated stripe 26 makes electrical contact with the first level stripes 24 through via holes 30 in glass layer 20. The via hole 30 can either be directly over the apertures 25 in silicon dioxide layer 18 or laterally displaced therefrom. When the via holes 30 are adequately displaced from the apertures in the silicon dioxide layer, the possibility of poisoning of the semiconductor body by diffusion of the copper metal in the second level is virtually nonexistant. When the via holes are positioned directly over the apertures 25 in the silicon dioxide layer, a first level metallurgy must be capable of providing a barrier which will resist the diffusion of the second level metallurgy, i.e. copper, during subsequent heating process steps. Disposed over the surface of layer 20 and also the second level metallurgy stripes 26 is a second glass layer 32. Electrical contact to the second level metallurgy is made through apertures 33 in glass layer 32 by the ball and pad terminal structure indicated. The terminal is comprised of a pad 34 having a lower layer of chromium 35, an intermediate layer of nickel or copper 36 and an upper layer of gold 37. A nickel plated copper ball 38 is joined to the pad by a mass of lead-tin solder 40. In the device of FIGURE 1 electrical contact to the body 12 is made through a back side mounting technique in which there is provided a laminated layer 42. Layer 42 consists of an inner layer of chromium 44, an intermediate layer of nickel or copper 46, and an exterior layer of gold 48. Layer 42 is soldered to a suitable supporting substrate.

The various insulating layers on device 10 can consist of any inorganic or organic amorphous materials and can be deposited by any suitable technique known to the prior art. The term glass as used in the specification is intended to cover any amorphous inorganic material including silicon nitride, silicon dioxide, silicon monoxide, etc. For example, silicon dioxide layer 18 can be deposited by RF sputtering, or heating the body in a steam environment. Layer 20 can be deposited by RF sputtering, pyrolytic techniques, or glass sedimentation followed by a fusion step. The upper layer of glass 32 must be put on under a non-oxidizing condition to prevent the degradation of the second metallurgy level. Glass layer 32 is preferably deposited by RF sputtering. The various metal layers can be deposited by metal evaporation techniques followed by selective removal of the subsequent evaporated layer by known techniques. The solder pad terminal structure per se and the mode of fabricating are described in commonly assigned U.S. patent application, Ser. No. 658,128, filed July 13, 1967.

Copper is well known in the electrical art as an electrical conductor. The electrical conductivity of copper is high. However, its use in semiconductor applications has been largely avoided in the past because of its well-known junction poisoning effects. Any diffusion of copper into the semiconductor body renders the device useless. Normally a number of process steps which require heating follow the deposition of conductive stripes in the fabrication of integrated circuit devices. This repeated heating presents very favorable conditions for metal diffusion and subsequent destruction of the device.

The interconnection metallurgy for integrated circuit devices of the invention by utilizing copper in the second level only in a laminated structure attains all of the advantages of its high inherent conductivity. Other advantages also accrue to the use of copper as a second level metallurgy as for example, copper has very high resistance to current induced metal electromigration. The use of chromum layers on each side of the copper layer in the laminated structure maintains conductivity through heat treatments up to and approximately 550°, and the chromium-copper-chromium composite layer resists attacks by HF based etchants which are used for opening via holes and terminal holes in the glass as for example in upper layer 32.

Figure 2:
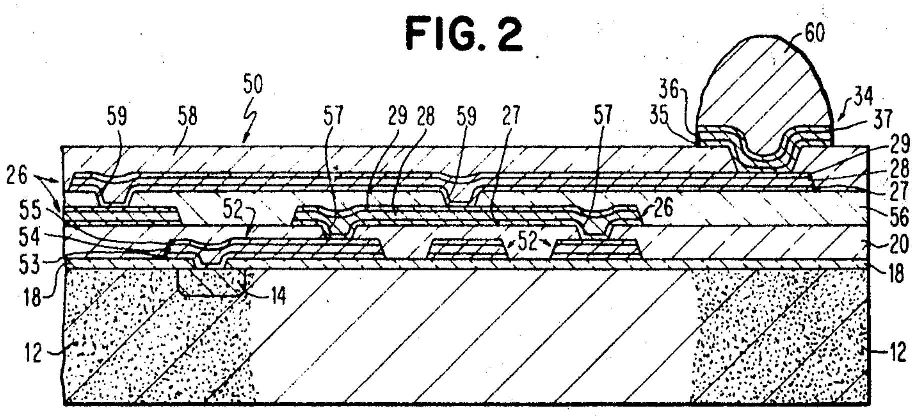
FIGURE 2 is a cross-sectional view in broken section of another preferred specific embodiment of a multilevel interconnection metallurgy structure of the invention for a monolithic integrated semiconductor device.

Referring now to FIGURE 2 of the drawings, there is depicted another embodiment of the multi-level interconnection metallurgy structure of the invention mounted on device 50. Device 50 has a semi-conductor body 12 with a silicon dioxide or a silica layer 18 bonded to the upper surface thereof. Body 12 has diffused area 14 of an opposite conductivity type. The first level of the metallurgy consists of the laminar stripe 52 having a lower layer 53 of chromium, a center relatively thick layer of silver, 54, and an upper layer 55 of chromium. As indicated in FIGURE 2, the chromium layer 53 is in direct contact with the upper surface of body 12 through aperture 25. Alternately, the first level can consist of a laminar layer of silver disposed between layers of molybdenum or molybdenum per se. An insulating layer of glass 20 is disposed over layer 18 and first level stripes 52. Disposed on the top of layer 20 and bonded thereto is the second and third metallurgy levels having a stripe configuration 26 similar to the stripe configuration described in FIGURE 1. It is understood that the various configurations of the first, second, and third level stripes can be of any suitable design providing for cross-overs, inter-connections, and various other techniques known to the prior art. Overlying layer 20 and the second level metallurgy is an intermediate bonded glass layer 56 having an aperture 57. Overlying layer 56 and the intermediate metallurgy stripe structure is a top bonded glass layer 58. Electrical contact between the upper metallurgy level and the intermediate metallurgy level is made through via holes 59 in layer 56. Electrical contact between the intermediate metallurgy structure and the first metallurgy level structure is made through via holes 57 in layer 20. A solder pad structure having a laminated pad 34 similar in structure to the pad 34 described in FIGURE 1 is provided, having a mass of solder 60 adhered thereto. The general method of making the solder connection is described and depicted in commonly assigned U.S. patent application, Ser. No. 466,625, filed June 24, 1965.

While the invention has been particularly shown and described with reference to preferred embodiments thereof, it will be understood by those skilled in the art that the foregoing and other changes in form and detail may be made therein without departing from the spirit and scope of the invention.

We claim:

1. A multilevel interconnection metallurgy structure for a hermetically sealed planar semi-conductor device having a semiconductor body, a first insulating layer overlying the surface of the body, and at least one additional insulating layer overlying the said first insulating layer and hermetically bonded thereto, said terminal structure comprised of, a contact stripe overlying and bonded to the surface of said first insulating layer and underlying said additional insulating layer, and making ohmic contact to said semiconductor body through an aperture in said first insulating layer, a laminar stripe bonded to said additional insulating layer and in electrical contact with said contact stripe through an aperture in said additional insulating layer, said laminar stripe comprised of a layer of copper disposed between layers of chromium, and terminal means in electrical contact with said laminar stripe.

2. The interconnection metallurgy strutcure of claim 1 wherein said contact stripe is comprised of a layer of silver disposed between layers of chromium.

3. The interconnection metallurgy structure of claim 1 wherein said contact stripe is comprised of a layer of molybdenum with an underlying ohmic contact layer of a material selected from a group consisting of platinum silicide, palladium silicide, and mixtures thereof.

4. The interconnection metallurgy structure of claim 1 wherein said contact stripe is comprised of a layer of tungsten with an underlying ohmic contact layer of a material selected from a group consisting of platinum silicide, palladium silicide, and mixtures thereof.

5. The interconnection metallurgy structure of claim 1 wherein said contact stripe is comprised of a laminar structure having a layer of gold disposed between layers of molybdenum.

6. The interconnection metallurgy structure of claim 1 wherein said aperture in said first insulating layer is laterally displaced from said aperture in said layer of glass.

7. The interconnection structure of claim 1 wherein an additional layer of glass is disposed over said layer of glass and said laminar stripe.

8. The interconnection structure of claim 1 wherein electrical contact between said laminar stripe, and said terminal means is established by at least one additional insulated metallurgy layer.

9. An improved multilevel interconnection metallurgy structure for a hermetically sealed planar semiconductor device having a semiconductor body, a plurality of bonded insulating layers of amorphous inorganic material overlying the body, and a plurality of interconnected network layers of conductive stripes sandwiched between the insulated layers, the improvement comprising, at least one network layer having a stripe structure comprised of a layer of copper disposed between layers of chromium.

References Cited

UNITED STATES PATENTS

| | | | |
|---|---|---|---|
| 3,241,931 | 3/1966 | Triggs et al. | 29—195 |
| 3,290,565 | 12/1966 | Hastings | 317—234 |
| 3,290,570 | 12/1966 | Cunningham et al. | 317—240 |

JOHN W. HUCKERT, Primary Examiner

R. F. POLISSACK, Assistant Examiner

U.S. Cl. X.R.

317—235